(12) United States Patent
Chow et al.

(10) Patent No.: US 7,838,899 B2
(45) Date of Patent: Nov. 23, 2010

(54) INTEGRATED CIRCUIT PACKAGE SYSTEM WITH IMAGE SENSOR SYSTEM

(75) Inventors: Seng Guan Chow, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/623,351

(22) Filed: Nov. 20, 2009

(65) Prior Publication Data
US 2010/0065936 A1    Mar. 18, 2010

Related U.S. Application Data

(62) Division of application No. 11/326,206, filed on Jan. 4, 2006.

(51) Int. Cl.
*H01L 29/24* (2006.01)
*H01L 31/0203* (2006.01)

(52) U.S. Cl. .................. 257/100; 257/433; 257/787; 257/784; 257/E31.105

(58) Field of Classification Search ............ 257/100, 257/98, 787, 784, E21.502, 433, E31.105
See application file for complete search history.

(56) References Cited

U.S. PATENT DOCUMENTS

| | | | |
|---|---|---|---|
| 4,524,121 A | | 6/1985 | Gleim et al. |
| 4,697,203 A | | 9/1987 | Sakai et al. |
| 4,894,707 A | | 1/1990 | Yamawaki et al. |
| 5,214,307 A | | 5/1993 | Davis |
| 5,607,227 A | | 3/1997 | Yasumoto et al. |
| 5,844,315 A | | 12/1998 | Melton et al. |
| 5,973,337 A | * | 10/1999 | Knapp et al. ............ 257/99 |
| 6,121,682 A | | 9/2000 | Kim |
| 6,130,448 A | | 10/2000 | Bauer et al. |
| 6,143,588 A | * | 11/2000 | Glenn ...................... 438/116 |
| 6,144,507 A | * | 11/2000 | Hashimoto .............. 359/819 |
| 6,204,562 B1 | | 3/2001 | Ho et al. |
| 6,225,699 B1 | | 5/2001 | Ference et al. |
| 6,246,123 B1 | | 6/2001 | Landers, Jr. et al. |
| 6,266,197 B1 | | 7/2001 | Glenn et al. |
| 6,291,263 B1 | | 9/2001 | Huang |
| 6,291,884 B1 | * | 9/2001 | Glenn et al. ............ 257/747 |
| 6,297,131 B1 | | 10/2001 | Yamada et al. |
| 6,353,257 B1 | | 3/2002 | Huang |
| 6,358,773 B1 | | 3/2002 | Lin et al. |
| 6,369,454 B1 | | 4/2002 | Chung |
| 6,372,551 B1 | | 4/2002 | Huang |
| 6,379,988 B1 | | 4/2002 | Peterson et al. |
| 6,384,472 B1 | | 5/2002 | Huang |
| 6,396,116 B1 | | 5/2002 | Kelly et al. |
| 6,407,381 B1 | | 6/2002 | Glenn et al. |
| 6,420,204 B2 | | 7/2002 | Glenn |
| 6,420,244 B2 | | 7/2002 | Lee |
| 6,455,353 B2 | | 9/2002 | Lin |
| 6,503,780 B1 | | 1/2003 | Glenn et al. |
| 6,512,219 B1 | | 1/2003 | Webster et al. |

(Continued)

*Primary Examiner*—Nitin Parekh
(74) *Attorney, Agent, or Firm*—Mikio Ishimaru

(57) ABSTRACT

An integrated circuit package system is provided including providing a wafer including image sensor systems having interconnects connected thereto and encapsulating the image sensor systems and interconnects in a transparent encapsulant. The system includes removing a portion of the transparent encapsulant to expose portions of the interconnects and singulating the wafer to form image sensor devices including at least one of the image sensor systems and a number of the interconnects.

8 Claims, 5 Drawing Sheets

U.S. PATENT DOCUMENTS

| | | |
|---|---|---|
| 6,534,419 B1 | 3/2003 | Ong |
| 6,566,745 B1 * | 5/2003 | Beyne et al. ............... 257/680 |
| 6,571,466 B1 * | 6/2003 | Glenn et al. ................ 29/841 |
| 6,610,563 B1 | 8/2003 | Waitl et al. |
| 6,613,980 B1 | 9/2003 | McGhee et al. |
| 6,627,864 B1 | 9/2003 | Glenn et al. |
| 6,692,993 B2 | 2/2004 | Li et al. |
| 6,693,364 B2 | 2/2004 | Tao et al. |
| 6,713,366 B2 | 3/2004 | Mong et al. |
| 6,774,475 B2 | 8/2004 | Blackshear et al. |
| 6,784,534 B1 | 8/2004 | Glenn et al. |
| 6,791,076 B2 | 9/2004 | Webster |
| 6,815,254 B2 | 11/2004 | Mistry et al. |
| 6,828,665 B2 | 12/2004 | Pu et al. |
| 6,833,612 B2 | 12/2004 | Kinsman |
| 6,847,109 B2 | 1/2005 | Shim |
| 6,852,570 B2 | 2/2005 | Hasegawa |
| 6,861,683 B2 | 3/2005 | Rissing et al. |
| 6,873,034 B2 * | 3/2005 | Nakamura et al. .......... 257/680 |
| 6,881,611 B1 | 4/2005 | Fukasawa et al. |
| 6,891,239 B2 | 5/2005 | Anderson et al. |
| 6,916,683 B2 | 7/2005 | Stephenson et al. |
| 7,355,274 B2 | 4/2008 | Lim |
| 7,364,945 B2 | 4/2008 | Shim et al. |
| 7,372,141 B2 | 5/2008 | Karnezos et al. |
| 7,391,153 B2 * | 6/2008 | Suehiro et al. .............. 313/512 |
| 7,456,035 B2 | 11/2008 | Eliashevich et al. |
| 7,456,088 B2 | 11/2008 | Park et al. |
| 7,723,159 B2 | 5/2010 | Do et al. |
| 2003/0008510 A1 | 1/2003 | Grigg et al. |
| 2005/0075053 A1 | 4/2005 | Jung |
| 2006/0073635 A1 | 4/2006 | Su et al. |
| 2007/0141751 A1 | 6/2007 | Mistry et al. |
| 2007/0148822 A1 | 6/2007 | Haba et al. |
| 2007/0158809 A1 | 7/2007 | Chow et al. |
| 2007/0181895 A1 | 8/2007 | Nagai |

\* cited by examiner

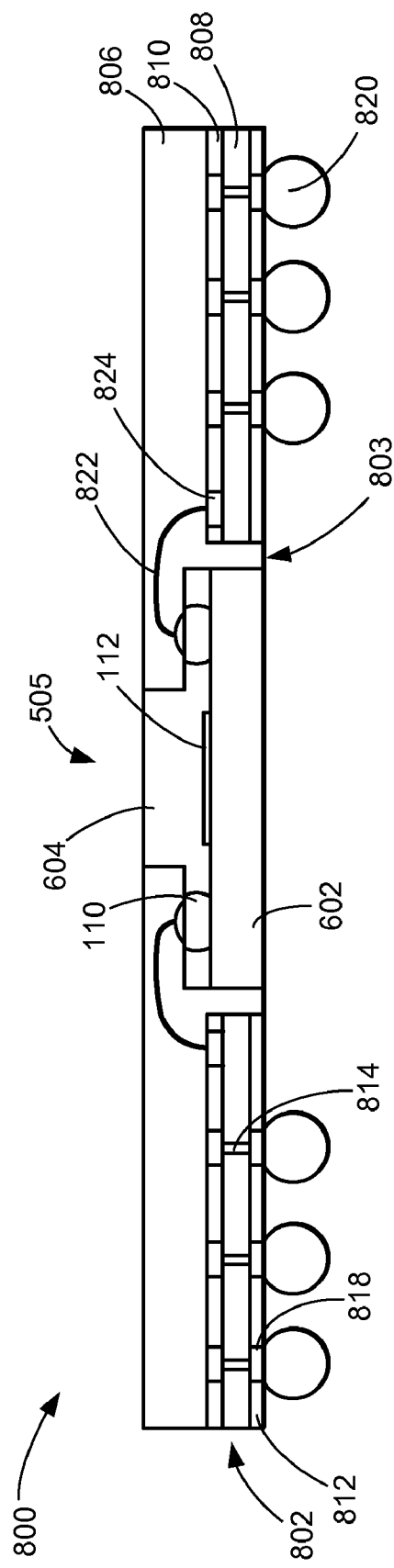
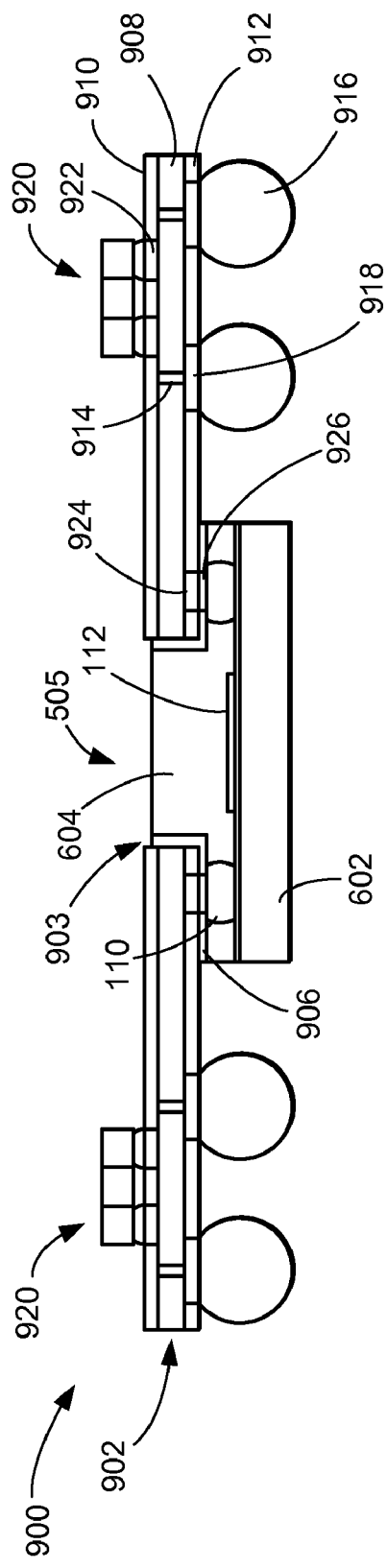

INTEGRATED CIRCUIT PACKAGE SYSTEM WITH IMAGE SENSOR SYSTEM

CROSS-REFERENCE TO RELATED APPLICATION(S)

This application claims the benefit of U.S. patent application Ser. No. 11/326,206 filed Jan. 4, 2006, and the subject matter thereof is incorporated herein by reference thereto.

The present application contains subject matter related to concurrently filed U.S. patent application Ser. No. 11/306,627, now U.S. Pat. No. 7,456,088 B2, which is assigned to STATS ChipPAC Ltd. The subject matter thereof is hereby incorporated by reference thereto.

The present application also contains subject matter related to concurrently filed U.S. patent application Ser. No. 11/326,211, which is assigned to STATS ChipPAC Ltd. The subject matter thereof is hereby incorporated by reference thereto.

The present application also contains subject matter related to concurrently filed U.S. patent application Ser. No. 11/306,628, now U.S. Pat. No. 7,364,945 B2, which is assigned to STATS ChipPAC Ltd. The subject matter thereof is hereby incorporated by reference thereto.

TECHNICAL FIELD

The present invention relates generally to integrated circuit package systems, and more particularly to an image sensor package system.

BACKGROUND ART

In the electronics industry, as products such as cell phones and camcorders become smaller and smaller, increased miniaturization of integrated circuit (IC) packages has become more and more critical. At the same time, higher performance and lower cost have become essential for new products.

In these assemblies, an image sensor was located within a housing, which supported a window. Radiation passed through the window and struck the image sensor, which responded to the radiation.

Also in these assemblies, an image sensor was mounted to a substrate. After the image sensor was mounted, a housing was mounted around the image sensor and to the substrate. This housing provided a hermetic like barrier around the image sensor, while at the same time, supported a window above the image sensor.

As the technology moves to smaller and lighter weight electronic devices, it has become increasingly important that the size of the image sensor assembly used within these electronic devices is reduced. Unfortunately, conventional image sensor assemblies require a housing to support the window and to hermetically seal the image sensor and these housings are relatively bulky and extend upwards from the substrate a significant distance.

In addition, mounting these housings at the substrate level is inherently labor intensive and makes repair or replacement of the image sensors difficult. In particular, removal of the housing exposes the image sensor to the ambient environment. Since the image sensor is sensitive to dust as well as other environmental factors, it is necessary to make repairs or replacement of the image sensors in a controlled environment, such as a clean room. Otherwise, there was a risk of damaging or destroying the image sensor.

Since neither of these alternatives is desirable and both are expensive, there has been a long felt need for an image sensor assembly, which is simple to manufacture and service so that costs associated with the image sensor assembly are minimized.

A solution has been the development of a completely encapsulated image sensor packages. However, encapsulated image sensor packages typically require a custom-made mold chase to pre-form a package cavity for housing the image sensor. The drawback of such custom-made mold chases is their high cost of manufacture.

Further, encapsulated image sensor packages require the use of custom-made substrates, which also have a high manufacturing cost.

Even further, the fabrication methods used to fabricate the image sensor package involve a relatively large number of processes.

Solutions to these problems have been long sought, but prior developments have not taught or suggested any solutions and, thus, solutions to these problems have long eluded those skilled in the art.

DISCLOSURE OF THE INVENTION

The present invention provides an integrated circuit package system including providing a wafer including image sensor systems having interconnects connected thereto and encapsulating the image sensor systems and interconnects in a transparent encapsulant. The system includes removing a portion of the transparent encapsulant to expose portions of the interconnects and singulating the wafer to form image sensor devices including at least one of the image sensor systems and a number of the interconnects.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 8 is a cross-sectional view of an image sensor package in accordance with a second embodiment of the present invention;

FIG. 9 is a cross-sectional view of an image sensor package in accordance with a third embodiment of the present invention;

BEST MODE FOR CARRYING OUT THE INVENTION

Figure 1:
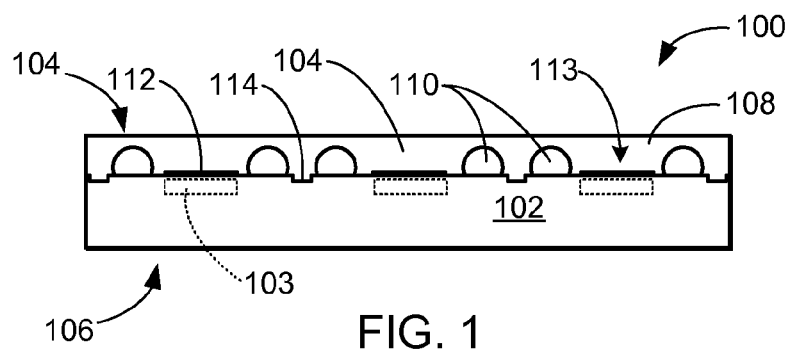
FIG. 1 is a cross-sectional view of an image sensor wafer in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. Generally, the device can be operated in any orientation. The same numbers are used in all the drawing FIGs. to relate to the same elements.

The term "horizontal" as used herein is defined as a plane parallel to the conventional plane or surface of the wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an image sensor wafer 100 in accordance with an embodiment of the present invention. The image sensor wafer 100 includes a wafer 102, made of a material such as silicon, with a top surface 104 and a bottom surface 106. A number of integrated circuits 103 are formed in and on the wafer 102.

A number of photosensitive structures 112 are formed on the wafer 102 over the integrated circuits 103 and connected to the integrated circuits to form image sensor systems 113. The image sensor system 113 is connected to electrical connections or interconnects 110 for electrical connections off of the image sensor wafer 100. The interconnects 110 are connective structures such as solder bumps, solder balls, conductive pillars, etc.

A number of saw streets 114 are formed into a portion of the top surface 104 of the wafer 102 to cordon off the photosensitive structures 112.

A transparent encapsulating material 108, such as transparent epoxy, is applied on the top surface 104 of the wafer 102 by spinning, molding, or a number of other processes to cover and encapsulate the interconnects 110 and the photosensitive structures 112. The transparent encapsulating material 108 is transparent to the radiation, such as light, which the photosensitive structures 112 sense.

Figure 2:
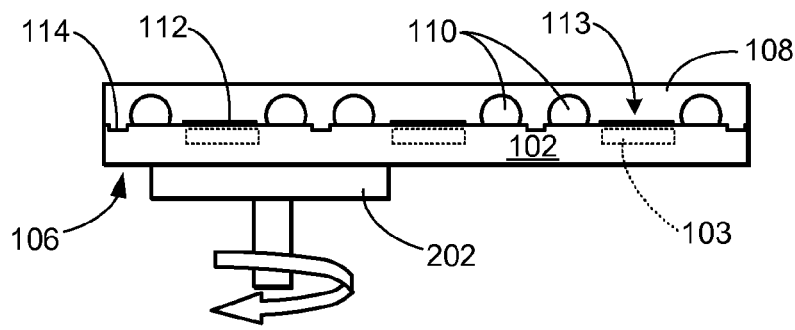
FIG. 2 is the structure of FIG. 1 in a grinding step.

Referring now to FIG. 2, therein is shown the structure of FIG. 1 in a grinding step in accordance with an embodiment of the present invention. The bottom surface 106 of the wafer 102 is planarized to a specified surface flatness and thickness. In accordance with one embodiment, the bottom surface 106 is planarized by grinding using a grinding wheel 202.

The planarization permits the wafer 102 to be extremely thin but partially supported for strength by the transparent encapsulating material 108 so it may be safely handled. This extreme thinness also helps reduce the package profile.

Figure 3:
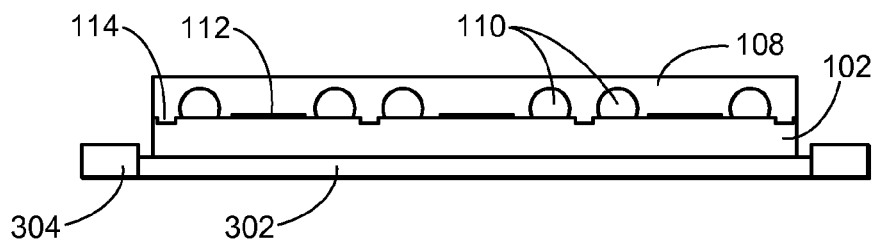
FIG. 3 is the structure of FIG. 2 in a singulation tape lamination step.

Referring now to FIG. 3, therein is shown the structure of FIG. 2 on a singulation tape lamination step in accordance with an embodiment of the present invention. The wafer 102 is mounted on a singulation tape 302 enclosed within a mounting frame 304.

Figure 4:
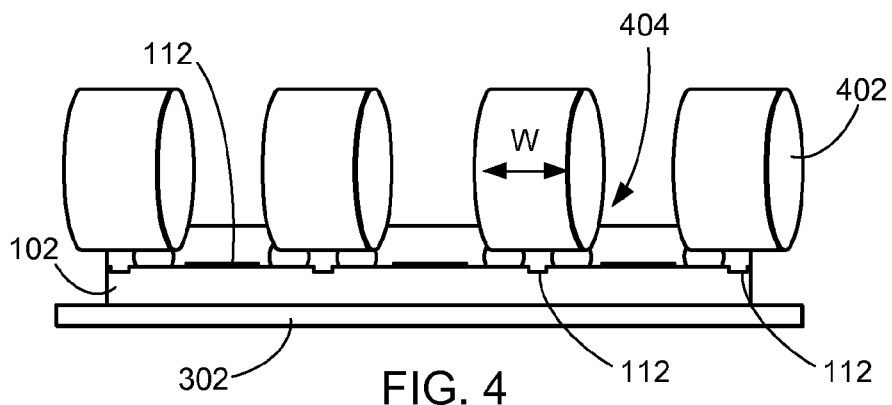
FIG. 4 is the structure of FIG. 3 in a notching step.

Referring now to FIG. 4, therein is shown the structure of FIG. 3 in a notching step in accordance with an embodiment of the present invention. A portion of the transparent encapsulating material 108 and a portion of the interconnects 110 are notched by a process such as etching or saw cutting. The notching process removes portions of the encapsulating material 108 on the sides of the photosensitive structures 112 to expose portions of the interconnects while leaving the encapsulating material 108 as the only material over the photosensitive structures 112. For example, thick saw blades 402 may be used for creating saw notches 404 of width "W" on a portion of the surface of the transparent encapsulating material 108 such that it exposes a portion of the interconnects 110. The saw notches 404 of FIG. 4 form recesses into the edges of the transparent encapsulating material 108 partially exposing a portion of the interconnects 110. The saw notches 404 reduce the thickness of the transparent encapsulating material 108, which must be sawn or lasered for singulation, while the transparent encapsulating material 108 helps prevent edge defects or breakage during the singulation operation.

Figure 5:
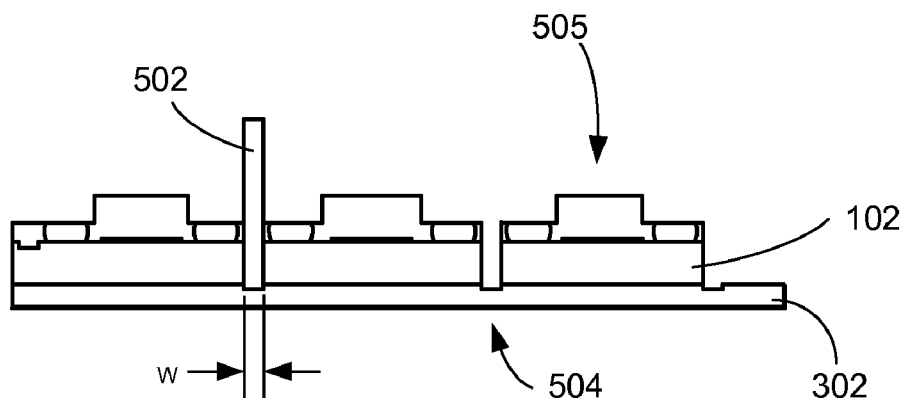
FIG. 5 is the structure of FIG. 4 in a singulation step.

Referring now to FIG. 5, therein is shown the structure of FIG. 4 in a singulation step in accordance with an embodiment of the present invention. The singulation step, which divides a wafer into a number of individual dies, can be performed in a number of different ways. For example, a singulation saw 502 may be used for cutting through the wafer 102 and the transparent encapsulating material 108 to create a cut 504 of width "w" at the saw streets 114 between each die structure to yield a number of image sensor devices 505.

Figure 6:
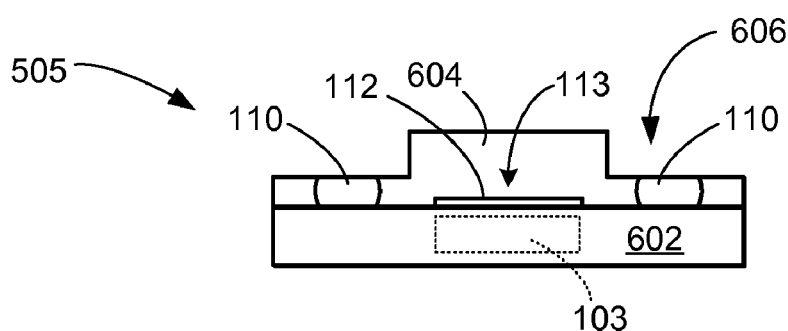
FIG. 6 is a cross-sectional view of one of the image sensor devices.

Referring now to FIG. 6, therein is shown a cross-sectional view of one of the image sensor devices 505. The image sensor device 505, as a unit, includes an integrated circuit die 602, at least image sensor system 113, a number of interconnects 110, and a transparent encapsulant 604.

The image sensor device 505 can be one of a number of different types of devices depending on the photosensitive structure 112. For example, the image sensor device 505 could be a charge coupled device (CCD) or complementary metal-oxide semiconductor (CMOS) image sensor device.

The transparent encapsulant 604 is of a clear and optically transparent material for the transmission of light waves to the photosensitive structure 112. The transparent encapsulant 604 has a number of notches 606, which are formed into at least one edge of the transparent encapsulant 604. In a quad-package, the notches 606 are on all four sides of the transparent encapsulant 604 for electrical connection to the integrated circuit die 602 and photosensitive structure.

The interconnects 110 are on the integrated circuit die 602 and may be manufactured from any electrically conductive material such as Pb, PbSn, PbSnAg, or Au. The interconnects 110 can have any shape such as a spherical, pillar, or stud shape.

It will be understood that when the integrated circuit die 602 is positioned with the transparent encapsulant 604 on top, the photosensitive structure 112 senses radiation from above between the interconnects 110. In this position, the image sensor device 505 is considered to be face up and, conversely, when the transparent encapsulant 604 is on the bottom, the image sensor device 505 is considered to be face down. In both positions, the top surface of the transparent encapsulant 604 between the interconnects 110 must only be covered, if it is covered, by a similarly transparent material.

Figure 7:
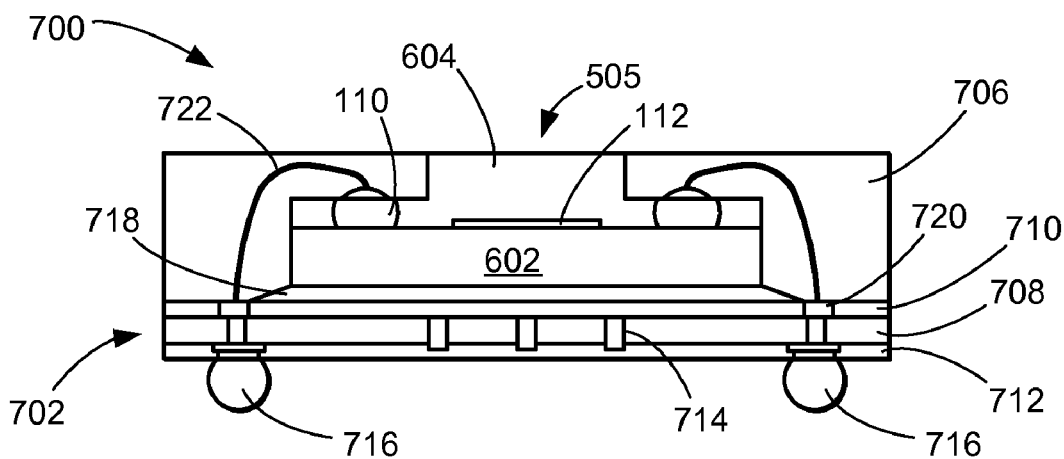
FIG. 7 is a cross-sectional view of an image sensor package in accordance with a first embodiment of the present invention.

Referring now to FIG. 7, therein is shown a cross-sectional view of an image sensor package 700 in accordance with a first embodiment of the present invention. The image sensor package 700 includes a substrate 702, the image sensor device 505, and a partially encapsulating mold compound 706.

The substrate 702 includes a base material 708 sandwiched between a top circuit layer 710 and a bottom circuit layer 712. The base material 708 can also be a rigid epoxy glass resin fiber composite, a flexible tape, a ceramic, or a leadframe.

A number of vias 714 electrically connect the top circuit layer 710 and the bottom circuit layer 712. Board connectors such as solder balls 716 are mounted to the bottom circuit layer 712 electrically connecting some of the vias 714.

The integrated circuit die 602 is attached to the top circuit layer 710 with an adhesive 718. The interconnects 110 are electrically connected to wire-bond pads 720 in the bottom circuit layer 712 with an electrically conductive bonding wires 722. Wire-bonding technique can be used to establish the electrical connection between the interconnects 110 and the wire-bond pads 720 on the base material 708. Optionally, tape automated bonding (TAB) technique can be used to establish the electrical connection between the interconnects 110 and the wire-bond pads 720 on the base material 708.

The image sensor package 700 can be assembled with the image sensor device 505 attached to a top side of the substrate 702. The image sensor package 700 can be configured as a SiP, MCM or stacked-die package format. A film-assist molding technique can be used to mold the top surface of the encapsulating mold compound 706 flush with the top surface of the transparent encapsulant 604 without the occurrence of mold flash.

Referring now to FIG. 8, therein is shown a cross-sectional view of an image sensor package 800 in accordance with a second embodiment of the present invention. The image sensor package 800 includes a substrate 802 having an aperture 803 and the image sensor device 505 disposed within the aperture 803. The image sensor device 505 is partially encapsulated within a mold compound 806.

The substrate 802 includes a base material 808 sandwiched between a top circuit layer 810 and a bottom circuit layer 812. The base material 808 can be a rigid epoxy glass resin fiber composite, a flexible tape, a ceramic, or a leadframe.

A number of vias 814 electrically connect wire-bond pads 824 at the top circuit layer 810 and solder pads 818 at the bottom circuit layer 812. Board connectors such as solder balls 820 are mounted to the solder pads 818 at the bottom circuit layer 812.

The interconnects 110 are electrically connected to interconnect wire-bond pads 824 in the bottom circuit layer 812 by electrically conductive bonding wires 822. Wire-bonding technique can be used to establish the electrical connection between the interconnects 110 and interconnect wire-bond pads 824 on the base material 808. Optionally, tape automated bonding (TAB) technique can be used to establish the electrical connection between the interconnects 110 and the wire-bond pads 824 on the base material 808.

The image sensor package 800, having a low profile, can be assembled with the image sensor device 505 face up within the aperture 803 of the substrate 802. The electrically conductive bonding wires 822 may include shorter wire lengths with the use of a low loop height wire-bonding technique and a reduced gap between the interconnects 110 and the interconnect wire-bond pads 824.

In accordance with another embodiment, a film-assist molding technique can be used to mold the final molding compound with top surface flush with the transparent encapsulant 604 without the occurrence of mold flash.

Referring now to FIG. 9, therein is shown a cross-sectional view of an image sensor package 900 in accordance with a third embodiment of the present invention. The image sensor package 900 includes a substrate 902 having an aperture 903 and the image sensor device 505 partially disposed within the aperture 903 and connected to the substrate 902 with a sealant 906, or bonding material for better mechanical protection and interconnection integrity.

The substrate 902 includes a base material 908 sandwiched between a top circuit layer 910 and bottom circuit layer 912. The base material 908 can be a rigid epoxy glass resin fiber composite, a flexible tape, a ceramic, or a leadframe.

A number of vias 914 electrically connect the top circuit layer 910 to the bottom circuit layer 912. A number of substrate connectors such as solder balls 916 are mounted to solder pads 918 in the bottom circuit layer 912. A passive or active device 920 is mounted to solder pads 922 in the top circuit layer 910. Other additional passive devices or active devices may also be mounted on or integrated on the top circuit layer 910.

The interconnects 110 are electrically connected to interconnect solder pads 924 in the bottom circuit layer 912 with electrical connections 926, such as a solder joint, an intermetallic layer, or an adhesive layer. The electrical connections 926 may be established using an SMT technique, an ultrasonic bonding technique, or a dot dispensing technique.

The image sensor package 900, having a low profile, can be assembled with the image sensor devices 505 face up within the aperture 903 of the substrate 902. The transparent encapsulant 604 protrudes through the aperture 903.

In accordance with another embodiment, a mold compound (not shown) or a glob-top material can be formed beneath the base material 908 to cover the image sensor device 505. In addition, the mold compound or glob-top material can also be formed to cover the peripheral region of the base material 908.

Figure 10:
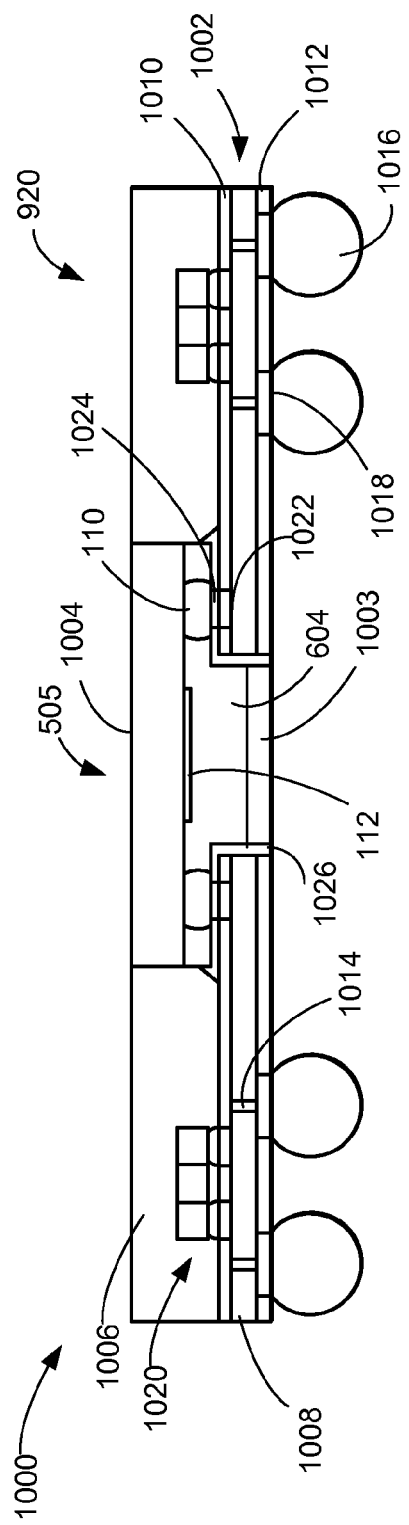
FIG. 10 is a cross-sectional view of an image sensor package in accordance with a fourth embodiment of the present invention.

Referring now to FIG. 10, therein is shown a cross-sectional view of an image sensor package 1000 in accordance with a fourth embodiment of the present invention. The image sensor package 1000 includes a substrate 1002 having an aperture 1003 and the image sensor device 505 partially disposed within the aperture 1003 and connected to the substrate 1002 with a sealant 1026, or bonding material for better mechanical protection and interconnection integrity. The image sensor device 505 is partially encapsulated within a mold compound 1006.

The substrate 1002 includes a base material 1008 sandwiched between a top circuit layer 1010 and a bottom circuit layer 1012. The base material 1008 can include a rigid epoxy glass resin fiber composite, a flexible tape, a ceramic, or a leadframe.

A number of vias 1014 electrically connect the top circuit layer 1010 to the bottom circuit layer 1012. A number of board connectors such as solder balls 1016 are mounted to solder pads 1018 in the bottom circuit layer 1012. A passive device 1020 is mounted to the top circuit layer 1010 and is also encapsulated within the mold compound 1006. Other additional passive devices or active devices may also be mounted on or integrated on the top circuit layer 1010.

The interconnects 110 are electrically connected to electrical contact pads 1022 in the top circuit layer 1010 with an electrical interconnection 1024. The electrical interconnection 1024 may be established using an SMT technique, an ultrasonic bonding technique, or a dot dispensing technique.

The image sensor package 1000, having a low profile, can be assembled with the image sensor devices 505 face down within the aperture 1003 of the substrate 1002.

Figure 11:
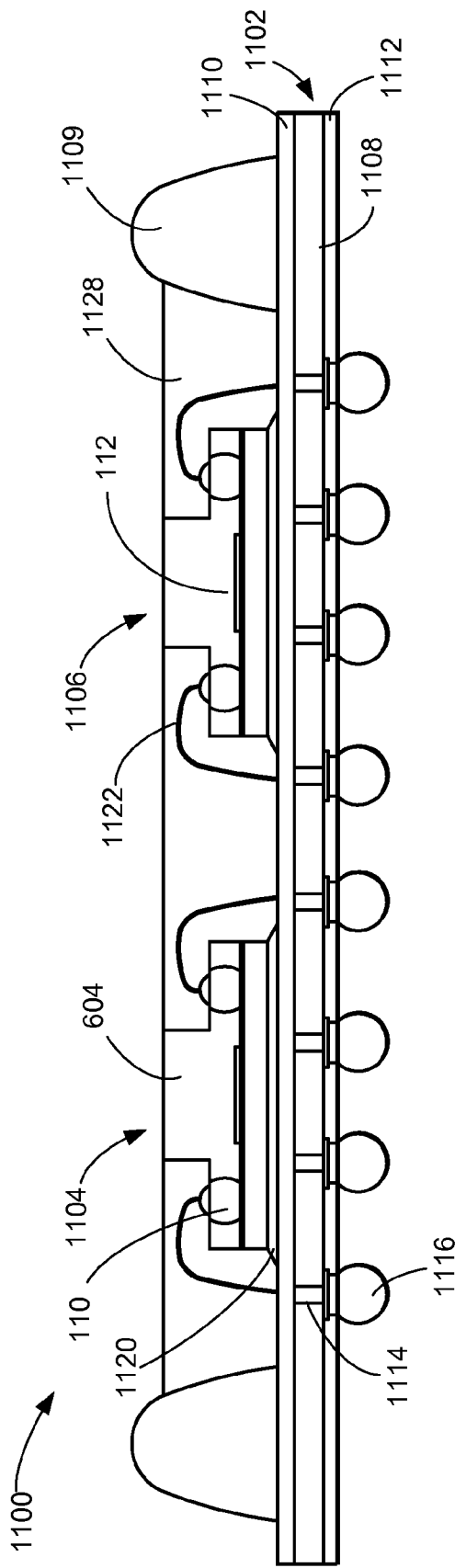
FIG. 11 is a cross-sectional view of an image sensor package in accordance with a fifth embodiment of the present invention.

Referring now to FIG. 11, therein is shown a cross-sectional view of an image sensor package 1100 in accordance with a fifth embodiment of the present invention.

The image sensor package 1100 includes a substrate 1102, a first image sensor device 1104 and a second image sensor device 1106, both similar to the image sensor device 505. The first image sensor device 1104 and the second image sensor device 1106 are partially encapsulated within a liquid encapsulant material 1128 limited by a dam 1109. The substrate 1102 includes a base material 1108 sandwiched between a top circuit layer 1110 and a bottom circuit layer 1112. The base material 1108 can be a rigid epoxy glass resin fiber composite, a flexible tape, a ceramic, or a leadframe.

A number of vias 1114 electrically connect the top circuit layer 1110 and the bottom circuit layer 1112. A number of substrate connectors such as solder balls 1116 are mounted to the bottom circuit layer 1112.

The first image sensor device 1104 and the second image sensor device 1106 are attached to the top circuit layer 1110 with an adhesive 1120. The interconnects 110 are electrically connected to the top circuit layer 1110 with electrically conductive bonding wires 1122.

The first image sensor device 1104 and the second image sensor device 1106 can be encapsulated together using a dam-and-fill method where the liquid encapsulant material 1128 fills the dam 1109 to just before the top surface of the transparent encapsulant 604 is covered. The liquid encapsulant material 1128 is then cured to a solid form.

Figure 12:
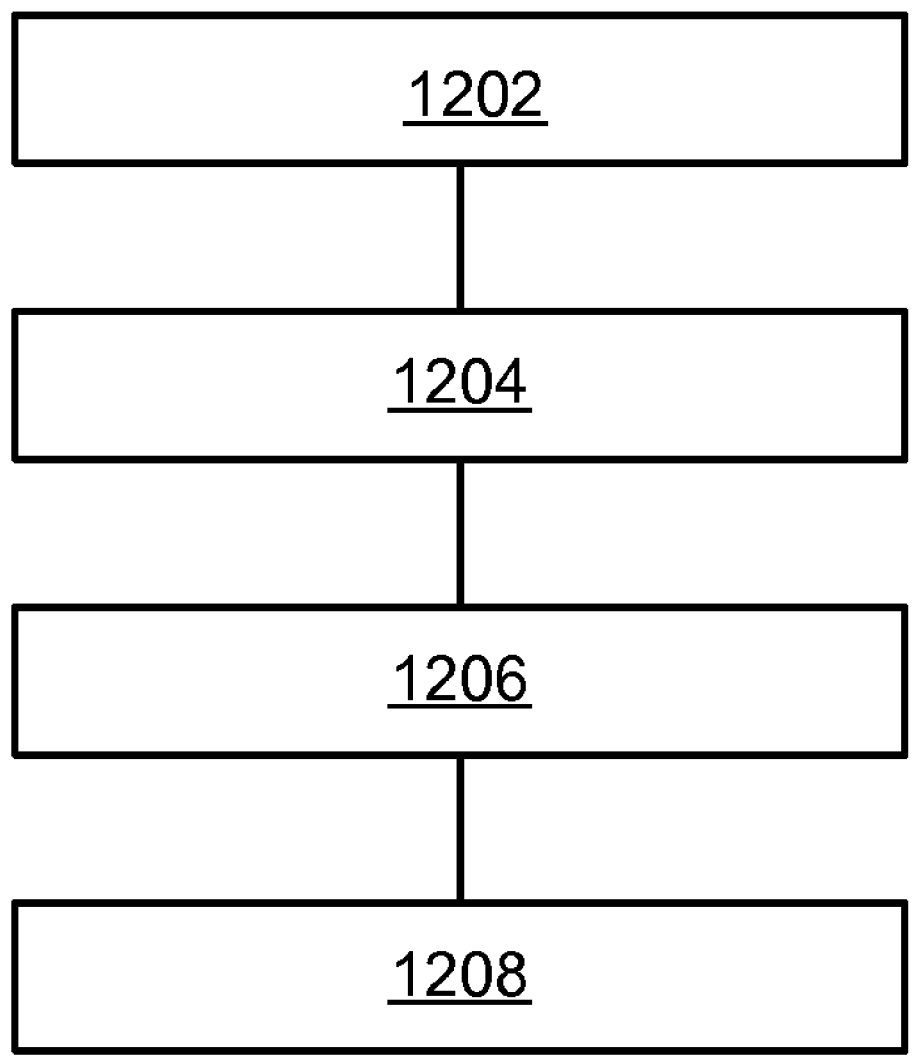
FIG. 12 is a flow chart of an integrated circuit package system for fabricating an integrated circuit package including an image sensor device in accordance with an embodiment of the present invention.

Referring now to FIG. 12, therein is shown a flow chart of an integrated circuit package system 1200 for fabricating an integrated circuit package 700 including an image sensor device 505 in accordance with an embodiment of the present invention. The system 1200 includes providing a wafer including image sensor systems having interconnects connected thereto in a block 1202; encapsulating the image sensor systems and interconnects in a transparent encapsulant in a block 1204; removing a portion of the transparent encapsulant to expose portions of the interconnects in a block 1206; and singulating the wafer to form image sensor devices including at least one of the image sensor systems and a number of the interconnects in a block 1208.

In greater detail, a method for fabricating an image sensor structure, according to an embodiment of the present invention, is performed as follows:
1. providing an image sensor wafer. (FIG. 1)
2. grinding a bottom side of the image sensor wafer. (FIG. 2)
3. mounting the image sensor wafer on a singulation tape. (FIG. 3)
4. cutting through a portion of the image sensor wafer with thick blades of width "W" to expose the interconnects. (FIG. 4)
5. cutting through the image sensor wafer mold with thin blades of width "w" to singulate the image sensor wafer into individual single image sensor devices. (FIG. 5)

It has been discovered that the present invention thus has numerous aspects.

An aspect is that the present invention includes a transparent encapsulating material that can serve as a protective layer for the chip photosensitive area and chip interconnects from the wafer back grinding process and assembly handling. The transparent encapsulating material can serve as a stiffener to prevent the occurrence of wafer warpage. The transparent encapsulating material allows the saw street (or saw scribe line) recognition for high accuracy singulation process. The transparent encapsulating material can serve as a buffer to prevent the die edges from chipping during notching and singulation. It also can serve as a hermetic sealant to prevent moisture ingression and contamination to the chip photosensitive area. The transparent encapsulating material further serves as a protective layer to prevent the liquid encapsulant material contaminating the chip photosensitive area when the dam-and-fill method is adopted to form the optical packages. The transparent encapsulating material can still further serve as an optical window to allow a clear image of the radiation impinging on the chip photosensitive area. The clear encapsulant allows the wafer level molding process to be adopted to improve productivity and lower manufacturing cost.

In contrast with prior arts, the present invention does not require the customized mold chase design in which a protruding part is required in order to make a cavity for depositing an optical transparent encapsulant and/or mounting an optical glass lid atop. An additional optical lens (not shown in embodiments) can be added on top of the transparent encapsulating material for better light focus of filter capability. A heat sink and/or shield member (not shown) can be attached to the package structure illustrated in FIG. 10 for better thermal management and/or EMI suppression.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. An integrated circuit package system comprising:
   an integrated circuit die including an image sensor system having interconnects connected thereto; and
   a transparent encapsulant on the integrated circuit die with portions of the interconnects exposed and with only the transparent encapsulant over the image sensor system to comprise an image sensor device;
   a substrate having passive or active devices electrically connected thereto and having an aperture provided therein;
   the image sensor device mounted face up or face down at least partially in the aperture with the interconnects connected to the substrate by bonding wires or electrical connections; and
   an encapsulant encapsulating the bonding wires.

2. The system as claimed in claim 1 wherein the image sensor device is mounted on the substrate with the interconnects connected to the substrate.

3. The system as claimed in claim 1 wherein
   the substrate having the aperture provided therein and board substrate connectors on the bottom thereof; and
   the image sensor device mounted on the substrate at least partially in the aperture and among the substrate connectors with the interconnects connected to the substrate.

4. The system as claimed in claim 1 further comprising:
   a dam around the periphery of the substrate,
   the image sensor device mounted on the substrate with the interconnects connected to the substrate; and
   a liquid encapsulant material around the image sensor device and filling the dam.

5. An integrated circuit package system comprising:
   an integrated circuit die including image sensor systems having interconnects connected thereto; and
   a transparent encapsulant encapsulating the image sensor systems with a notch to expose portions of the interconnects and with only the transparent encapsulant over the image sensor systems to comprise an image sensor device;

a substrate having passive or active devices electrically connected thereto and having an aperture provided therein;

the image sensor device mounted face up or face down at least partially in the aperture with the interconnects connected to the substrate by bonding wires or electrical connections; and an encapsulant encapsulating the bonding wires.

6. The system as claimed in claim 5 wherein the image sensor device is mounted face up on the substrate.

7. The system as claimed in claim 5 further comprising substrate connectors on the bottom of the aperture, the image sensor device mounted face up at least partially in the aperture and among the substrate connectors.

8. The system as claimed in claim 5 further comprising:
a dam around the periphery of the substrate; and
a solidified liquid encapsulant material in the dam to cover the bonding wires.

* * * * *